United States Patent
Helava et al.

(10) Patent No.: US 10,790,405 B2
(45) Date of Patent: Sep. 29, 2020

(54) OPTICALLY CONTROLLED POWER DEVICES

(71) Applicant: The Curators of the University of Missouri, Columbia, MO (US)

(72) Inventors: Heikki I. Helava, Dix Hills, NY (US); Randy D. Curry, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

(21) Appl. No.: 16/357,044

(22) Filed: Mar. 18, 2019

(65) Prior Publication Data

US 2019/0214520 A1 Jul. 11, 2019

Related U.S. Application Data

(63) Continuation of application No. 13/910,729, filed on Jun. 5, 2013, now abandoned.

(60) Provisional application No. 61/659,830, filed on Jun. 14, 2012.

(51) Int. Cl.
*H01L 31/16* (2006.01)
*H01L 31/0304* (2006.01)
*H01L 31/11* (2006.01)
*H01L 31/112* (2006.01)

(52) U.S. Cl.
CPC ...... *H01L 31/162* (2013.01); *H01L 31/03044* (2013.01); *H01L 31/112* (2013.01); *H01L 31/1105* (2013.01); *Y02E 10/544* (2013.01)

(58) Field of Classification Search
CPC ............. H01L 31/162; H01L 31/03044; H01L 31/1105
See application file for complete search history.

(56) References Cited

U.S. PATENT DOCUMENTS

| 4,782,222 | A * | 11/1988 | Ragle ................ H01L 31/02027 250/214 R |
| 7,058,309 | B1 * | 6/2006 | Eisenberger ......... G02B 6/4246 385/14 |
| 2008/0240173 | A1 * | 10/2008 | Holonyak .............. B82Y 20/00 372/9 |
| 2009/0041464 | A1 * | 2/2009 | Ledentsov ........ H01L 31/03523 398/87 |

* cited by examiner

*Primary Examiner* — Marc Anthony Armand
(74) *Attorney, Agent, or Firm* — Polsinelli PC (57) ABSTRACT

An electro-optically triggered power switch is disclosed utilizing a wide bandgap, high purity III-nitride semiconductor material such as BN, AlN, GaN, InN and their compounds. The device is electro-optically triggered using a laser diode operating at a wavelength of 10 to 50 nanometers off the material's bandgap, and at a power level of 10 to 100 times less than that required in a conventionally triggered device. The disclosed device may be configured as a high power RF MOSFET, IGBT, FET, or HEMT that can be electro-optically controlled using photons rather than an electrical signal. Electro-optic control lowers the power losses in the semiconductor device, decreases the turn-on time, and simplifies the drive signal requirements. It also allows the power devices to be operated from the millisecond to the sub-picosecond timeframe, thus allowing the power device to be operated at RF frequencies (i.e., kilohertz to terahertz range) and at high temperatures where the bandgap changes with temperature.

20 Claims, 5 Drawing Sheets

OPTICALLY CONTROLLED POWER DEVICES

CROSS-REFERENCE TO RELATED APPLICATIONS

This application is a continuation of U.S. patent application Ser. No. 13/910,729, filed Jun. 5, 2013, which claims priority to and the benefit of the filing date of U.S. Provisional Patent Application No. 61/659,830, filed Jun. 14, 2012, the disclosures of which are incorporated herein by reference for any and all purposes.

FIELD OF THE INVENTION

The present invention relates generally to semiconductor devices and, more particularly, to an electro-optically modulated semiconductor switch.

BACKGROUND OF THE INVENTION

In a typical semiconductor switch, an electric field is used to control the negative resistance characteristics of the device. For example, U.S. Pat. No. 3,742,318 discloses a semiconductor switch based on a field-effect type thyristor and a Hall-effect element. Alternately, a semiconductor switch may be designed, such as that disclosed in U.S. Pat. No. 4,107,721, to utilize an injected light signal, rather than an electric field, to control the conductivity of the device. By electro-optically controlling the device, the gate or base or trigger electrode capacitance can be eliminated, thereby lowering power losses, decreasing the turn-on time, and simplifying the drive signal requirements. It also allows the power devices to be operated at much higher frequencies, which in turn extends the useful range of the device.

In U.S. Pat. Nos. 4,782,222 and 4,864,119 a method of optically-triggering avalanche breakdown in a semiconductor is disclosed, the method using a laser diode as the optical trigger. The wavelength of the optical trigger, i.e., the laser diode, and the absorption coefficient of the semiconductor material are selected so that the absorption depth of the majority of the incident radiation is less than the distance between the contacts applied to the semiconductor. As a result, most of the high voltage is shifted beyond where the radiation is absorbed, causing significant field compression. A stated advantage of this approach is that the device is able to switch using a lower flux level trigger, and at a lower applied bias voltage, than a device designed to operate solely in an avalanche mode.

U.S. Pat. No. 8,183,512 discloses optically triggered power systems and devices. The disclosed power device includes a pair of terminals and a P-body region with an optical window. When optically triggered, the P-body region causes current to be conducted within an N⁻ drift region provided between the device's terminals. The disclosed power system includes, in addition to the power device, a controller for generating control signals and a converter for converting the electrical control signals to optical control signals. U.S. Pat. No. 8,294,078, a continuation-in-part of U.S. Pat. No. 8,183,512, further discloses a multi-stage power system that includes at least one optically triggered stage and at least one power device that is responsive to an output signal generated by the at least one optically triggered stage.

SUMMARY OF THE INVENTION

An electro-optically triggered power device (e.g., transistor, SCR, GTO) is provided that is comprised of a III-nitride semiconductor (e.g., BN, AlN, GaN, InN and their compounds) and a source of photons, where the output beam of the photon source is coupled to the III-nitride semiconductor and generates carriers within the semiconductor. The photon source may be a laser diode and the output beam may be coupled to the semiconductor using an optical fiber. The semiconductor may be doped and the Franz-Keldysh effect may be applied to the semiconductor to alter its photon absorption depth. The semiconductor may be undoped and the Franz-Keldysh effect may be applied to the semiconductor to alter its photon absorption depth. The wavelength of the photon source may be between 2 and 150 nanometers above or below the bandgap of the semiconductor. The conductivity of the semiconductor may vary in direct proportion to the photon source output intensity. The gate of the electro-optically triggered device may operate in an avalanche mode. The III-nitride semiconductor material may be grown via HVPE. The power device may further comprise a pair of ohmic contacts, or a pair of Schottky contacts, or a pair of metal contacts, coupled to the semiconductor. The electro-optically triggered power device may have a switching time in the range of a millisecond to less than a picosecond.

A further understanding of the nature and advantages of the present invention may be realized by reference to the remaining portions of the specification and the drawings.

DESCRIPTION OF THE SPECIFIC EMBODIMENTS

In accordance with the present invention, an electro-optically triggered power switch is disclosed utilizing a wide bandgap, high purity III-nitride semiconductor material. Although the preferred embodiment is based on GaN, the invention is equally applicable to other III-nitride materials such as BN, AlN, GaN, InN and their compounds. The device is electro-optically triggered using a laser diode operating at a wavelength of 2 to 150 nanometers from the material's bandgap, and at a power level of 10 to 100 times less than that required in a conventionally triggered device. The electro-optically triggered region of the semiconductor may be either biased or unbiased. The disclosed device may be configured as a high power RF MOSFET, IGBT, FET, HEMT, SCR or GTO that can be electro-optically controlled using photons rather than an electrical signal. Electro-optic control lowers the power losses in the semiconductor device, decreases the turn-on time, and simplifies the drive signal requirements. It also allows the power devices to be operated from the millisecond to the sub-picosecond timeframe, thus allowing the power device to be operated at RF frequencies (i.e., kilohertz to terahertz range) and at high temperatures where the bandgap changes with temperature.

In a conventional electro-optically triggered device, it is often necessary to tailor the stoichiometry of the material, for example using molecular beam epitaxy, CVD or even crystal growth processes, in order to match the bandgap of the material to the energy of the photons of the light source. Unfortunately, even using these approaches it is often not possible to match the bandgap to the photon energy available from a commercially-available laser diode. Furthermore, while the introduction of defect sites or impurities into the semiconductor material may allow the use of lower photon energies to generate carriers in the semiconductor, these impurities have the undesired effect of decreasing the material's electric field breakdown, resulting in significantly higher power losses than would otherwise be achieved with a high purity material. In contrast, the present invention utilizes extremely high purity material, thus allowing compact, low inductance, fast rise time, high frequency power devices to be fabricated. Additionally, by allowing conductive regions in the semiconductor material to be generated locally through the application of light to selected regions of the semiconductor, the present invention can be used to generate traveling wave devices.

In the present devices, the high electric field arising from the voltage applied across the positive and negative contacts varies the photon absorption depth by up to four orders of magnitude in accordance with the Franz-Keldysh effect, thereby allowing the current density and carrier concentration to be selected as required to electro-optically trigger the device using below bandgap or above bandgap photons from a laser diode. Most notably, this approach allows the absorption depth to be varied without the inclusion of impurities or traps in the material, thus not affecting the material's electric field breakdown. By operating either below or above the bandgap threshold, the absorption depth and absorption coefficient can be designed such that the depth of the photons can be used to select the on-resistance of the semiconductor device, and thus the current density. These qualities, which allow either vertical or horizontal devices to be fabricated, are important in both RF and power devices in order to limit fault mode currents. Additionally, as the number of photons required to generate the carriers in the semiconductor material using this approach is one to seven orders of magnitude less than that required using a conventional approach, the output power of the optical trigger (i.e., diode laser or other photon source) can be reduced, significantly enhancing the commercial viability of a power switch designed in accordance with the invention.

It is well known that direct bandgap semiconductors, such as GaAs, have significantly more attractive optical modulation characteristics than indirect bandgap materials such as Si or SiC. It is also known that wide bandgap (WBG) materials, with their order-of-magnitude higher intrinsic electrical breakdown fields, permit a much wider range of power devices than narrow bandgap (NBG) materials such as GaAs and Si. For example, GaN has an intrinsic breakdown field that is 10 times higher than that of GaAs. Accordingly, the present invention is focused on the direct bandgap family of III-nitride semiconductors including BN, AlN, GaN, InN and their compounds.

The intrinsic properties of GaN, an exemplary III-nitride material used for much of the present testing, allow a wide range of device possibilities. For example, undoped high-purity GaN has a high resistivity (e.g., residual carrier concentration typically less than $10^{15}$ cm$^{-3}$) and can therefore be used as a bulk device. GaN can also be easily doped as either n-type or p-type material, allowing the material to be used in pn junction diodes, pin diodes and Schottky diodes. These diodes can be converted to optical transistors and other high power switches by injecting light into the material to modulate its conductivity. Additionally, at high enough field strengths the GaN devices are expected to be usable in avalanche mode, in analogy with GaAs.

As noted above, undoped (i.e., intrinsic) high-purity GaN can be used as a bulk device (i.e., a device that does not include a junction) due to its low background carrier concentration, assuming that care is taken to use high purity source materials and that the material is accurately stoichiometric. The desired low leakage current for such a bulk device can also be achieved by compensating the usual residual negative carriers with positive carriers via impurity doping, for example doping with an impurity such as iron, thereby making the material highly resistive. Impurity doping, however, leads to a more complex optical behavior than that of pure GaN.

The inventors have found that uncompensated, high purity, high resistivity III-nitride material shows conductivity that follows and is directly proportional to the intensity of incident light. In contrast, compensated, high resistivity III-nitride material requires much greater optical intensity to generate equal conductivity, the required optical intensity tracking the level of compensation. Moreover, compensated material forms long-lived optically excited states that continue long after the optical signal has ended, as shown by a persistent conductivity with a decay time on the order of seconds to minutes. Accordingly, although highly compensated III-nitride material may be adequate for some optically activated switches (e.g., MOSFET and IGBT devices), assuming sufficient laser power is applied, they are not as ideally suited as uncompensated material for many device types (e.g., optically controlled high power transistor) given that the conductivity of the uncompensated material accurately tracks the optical modulation signal. The inventors have found, however, that a hybrid approach whereby the gate operates in avalanche mode and compensated GaN is utilized may be adequate for a power transistor whereby slower switching speeds and recovery mitigate commutation transients. It should be understood that the Franz-Keldysh mechanism utilized in the present invention does not require implantation or introduction of defects, although it can be used with compensated material. Accordingly, this mechanism can be used in either linear or avalanche mode.

While the invention may be applied to any semiconductor material, preferably the selected material is a direct bandgap semiconductor, more preferably a direct bandgap semiconductor with a wide bandgap (i.e., greater than 2 eV), and still more preferably a direct bandgap, highly resistive semiconductor with a wide bandgap that matches the photon energy of an available laser, for example a diode laser made from the same material system as the direct bandgap material used in the optical switch. As noted above, the present invention is focused on the direct bandgap family of III-nitride semiconductors including BN, AlN, GaN, InN and their compounds, although at least one preferred embodiment is based on GaN. Additionally, the material can be grown using any of a variety of techniques. For example, GaN can be bulk grown or pseudo-bulk grown as a thick epitaxy using a process such as HVPE, and epitaxial GaN films grown can be grown by any process (e.g., HVPE, LPE, MOVD, ammonothermal, and sodium flux) on any substrate (e.g., sapphire, silicon carbide, GaAs, and silicon). The inventors have found that HVPE is preferred due to the high intrinsic purity and the high growth rate of the process as well as the capability to include regions of high p- and n-type doping which are of primary interest for pin structures, contact formation and compensation doping.

In accordance with the invention, when a voltage is applied between the positive and negative contacts a leakage current is formed in the device, where the device is formed from a III-nitride material, preferably GaN. The leakage current is a function of the material resistivity as well as the thickness and type of metal used for the contacts. If the contact metal forms an ohmic contact with the device, e.g., Ni or Ti with the GaN in the preferred embodiment, the leakage current is determined only by the residual carrier concentration and is independent of the polarity of the applied voltage. If the contacts are Schottky metal, e.g., Au or Hg with the GaN in the preferred embodiment, the leakage current is determined by the metal/GaN Schottky and the polarity of the applied voltage. These switch characteristics define the background leakage current of the device, but not the operation of the switch. When a photon of energy greater than or near the bandgap energy is absorbed in the GaN an electron hole pair is formed. The electron is attracted to the positive contact and the hole is attracted to the negative contact. The drift velocity and mean free path, i.e., the speed of movement and the distance the hole or electron will drift in the electric field, in high purity GaN is longer than in low purity GaN, and therefore the hole-electron pair will drift farther in pure GaN before being recombined. As a result, less optical energy (e.g., photons from a diode laser) is required in order to generate sufficient hole-electron pairs to reduce the resistance of the GaN to a low value, i.e., turn the device on. Note that if the photons from the optical source are injected rapidly enough, the electric field is compressed by the generated conductivity and a carrier avalanche occurs.

It should be understood that the invention may be applied to a variety of switching device configurations including (i) pn junctions where the depletion layer of the pn junction forms the highly resistive layer, which is limited to relatively low voltage due to the junction breakdown; and (ii) pin structures where the intrinsic material forms the highly resistive layer (i.e., pure, highly resistive layer in the ideal case and compensated layer in the lowest leakage, highest voltage case). In general, due to the intrinsic breakdown strength of the selected material, devices in accordance with the invention may be designed to operate in the range of 100 V to 20 MV. The transistor and thyristor structures described in this patent have high gain and the electro-optical control of the devices reduces the light source to levels that are commercially feasible. Although the inherent breakdown strength of the material allows very high voltage switches to be built, lower voltage switches can be fabricated and operated either in series or parallel. Furthermore, the lower capacitance of the integrated or even distributed semiconductor device decreases the power losses and the relative high current gate or trigger requirements in traditional semiconductors.

EXEMPLARY EMBODIMENTS

Embodiment 1

Figure 1:
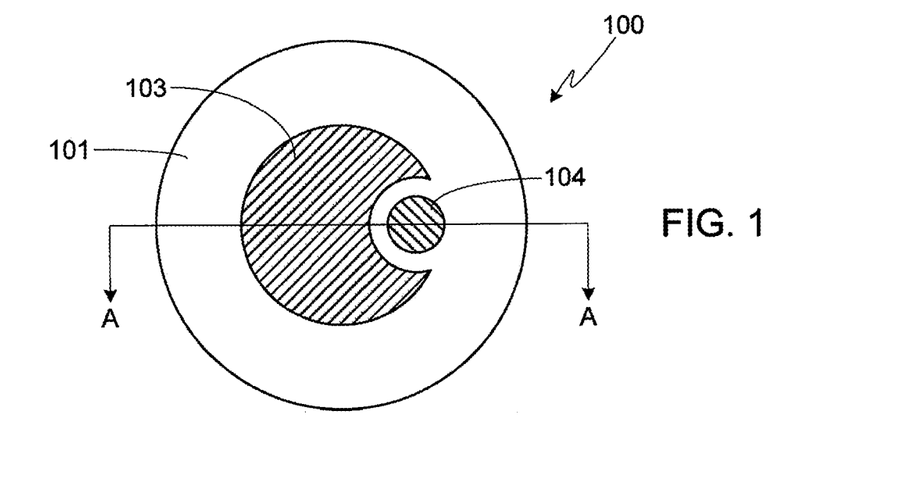
FIG. 1 provides a top view of an optically controlled Schottky diode-based transistor in accordance with the invention.
Figure 2:
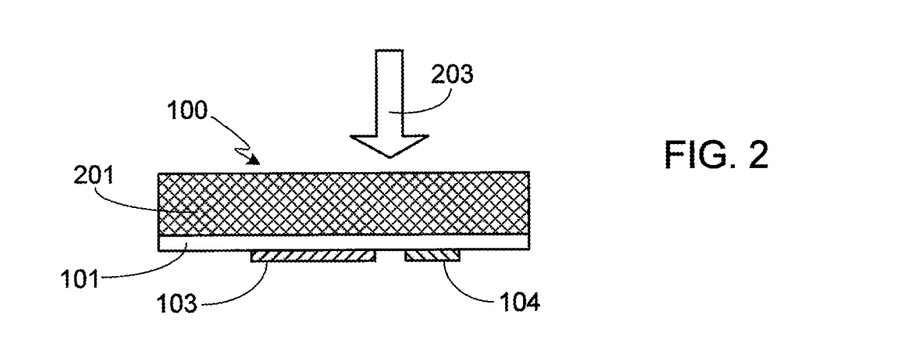
FIG. 2 provides a cross-sectional view taken along plane A-A of the optically controlled Schottky diode-based transistor shown in FIG. 1.
Figure 3:
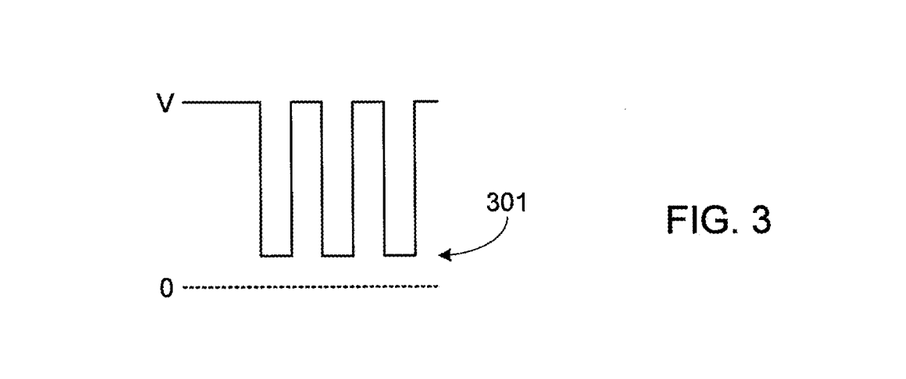
FIG. 3 illustrates the voltage measured between the contacts of the optically controlled Schottky diode-based transistor shown in FIGS. 1 and 2.

FIGS. 1 and 2 provide top and cross-sectional views, respectively, of an optically controlled Schottky diode-based transistor 100. Device 100 is comprised of a layer 101 of high purity, highly resistive GaN grown on a sapphire substrate 201 by HVPE. A pair of mercury contacts 103/104 forms a lateral Schottky diode with the GaN 101. When reverse biased, diode 100 effectively blocks any current flow between the contacts. Output beam 203 of a 405 nanometer laser diode is focused between the contacts 103/104, or focused on contact 104, of the lateral diode 100 and is modulated by a square wave signal generator. The current carried by the diode is proportional to the intensity of the laser light. If sufficient laser light is injected, the conductivity of the GaN can be increased at will. FIG. 3 shows the voltage measured between contacts 103/104 with the voltage decreasing as the current increases. Residual voltage 301 is due to the Schottky contact potential.

Embodiment 2

Figure 4:
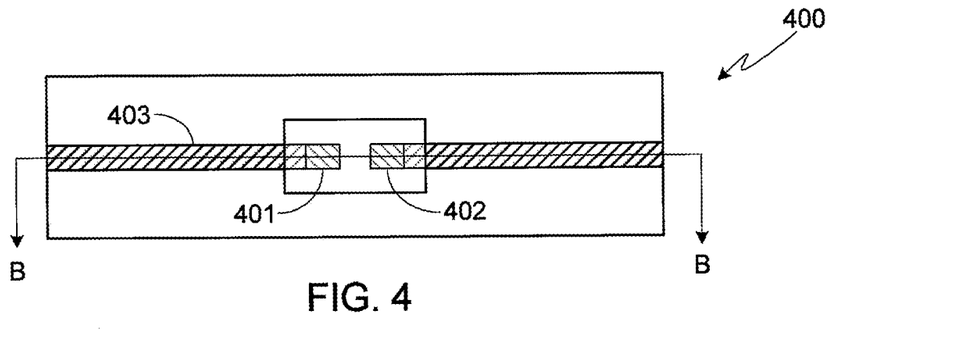
FIG. 4 provides a top view of a high speed optical switch in accordance with the invention.
Figure 5:
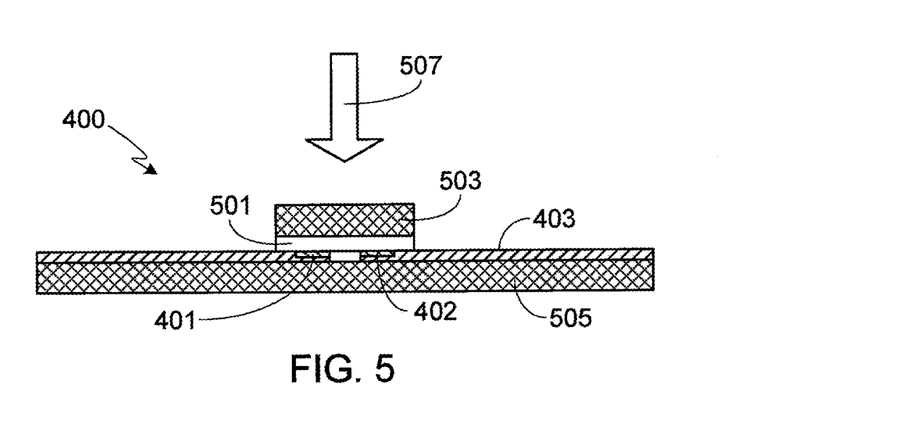
FIG. 5 provides a cross-sectional view taken along plane B-B of the high speed optical switch shown in FIG. 4.

FIGS. 4 and 5 provide top and cross-sectional views, respectively, of a high speed optical switch in accordance with the invention. As shown, device 400 is comprised of GaN 501 grown on a sapphire substrate 503 mounted between a pair of GaIn eutectic Ohmic contacts 401/402 on a 50 Ohm transmission line 403. Device 400 is mounted to a sapphire substrate 505. Since device 400 does not include a barrier such as pn junction or a Schottky contact to limit the current, the pulse forming line is pulse charged to high voltage. The typical charging time is 1 microsecond, albeit a slower charge pulse or even a nanosecond pulse can be used to charge the stripline configuration. The output beam 507 of a 405 nanometer laser diode is focused to fill the gap between the pulse forming line and the output 50 Ohm line.

Figure 6:
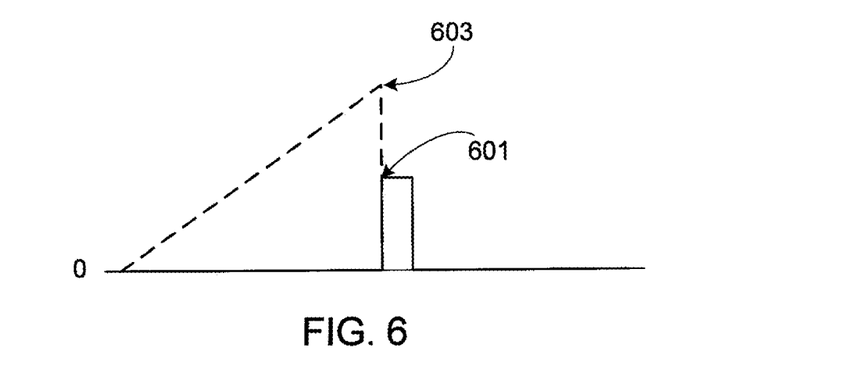
FIG. 6 illustrates the pulse characteristics of the device shown in FIGS. 4 and 5 in a standard pulse-forming configuration.

FIG. 6 illustrates the output pulse of device 400 when the laser diode is driven by a 250 picosecond rise-time, 2 nanosecond duration pulse generator. As shown, in a standard pulse-forming configuration the amplitude of output pulse 601 is half of the charging voltage 603 and the output pulse duration is 1 nanosecond, which is approximately half the duration of the laser charging pulse.

Figure 7:
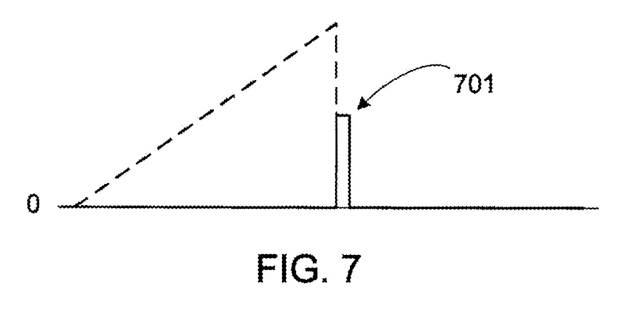
FIG. 7 illustrates the pulse characteristics of the device shown in FIGS. 4 and 5 when the duration of the laser trigger is less than 1 nanosecond.
Figure 8:
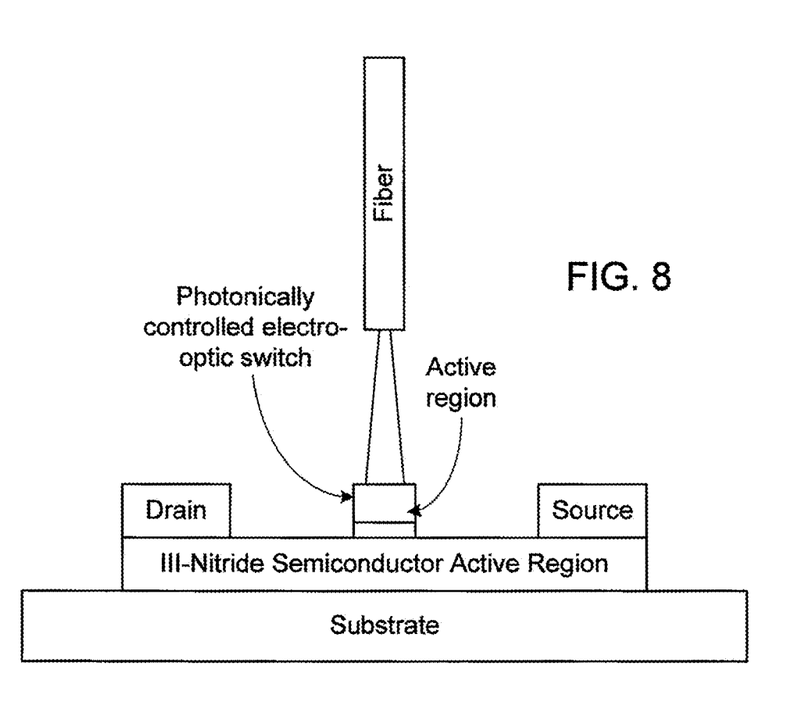
FIG. 8 illustrates an electro-optically controlled MOSFET using horizontal fabrication techniques in accordance with the invention.
Figure 9:
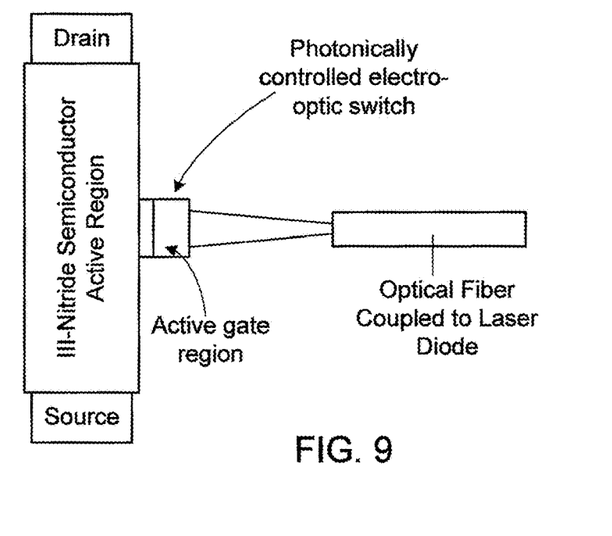
FIG. 9 illustrates a vertical MOSFET using a photonically controlled gate where the gate may be symmetrical or single-sided.
Figure 10A:
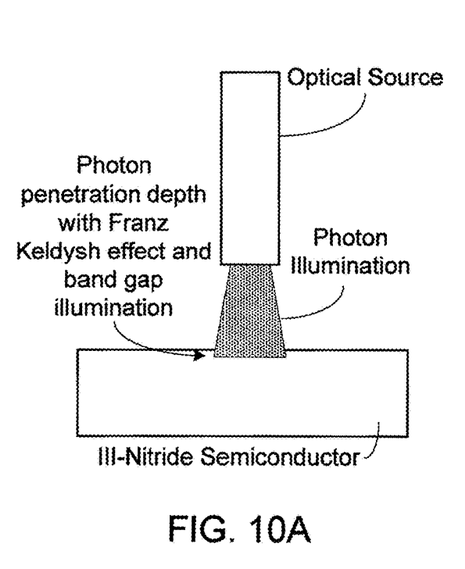
FIGS. 10A and 10B illustrate the effects of the Franz Keldysh effect on penetration depth.
Figure 10B:
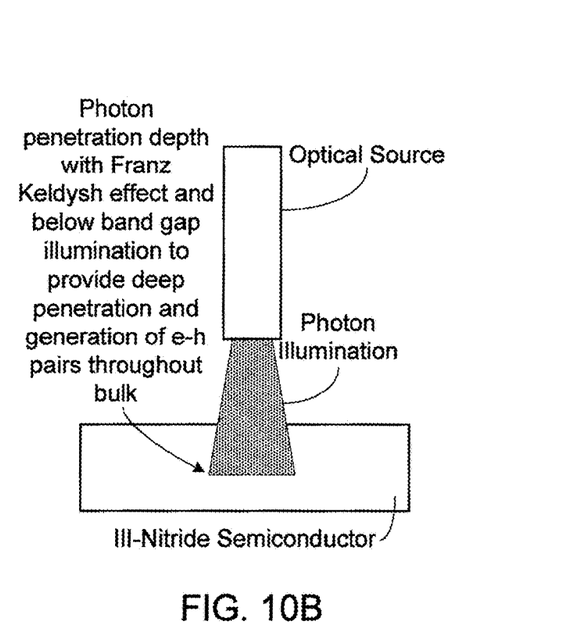
Figure 11:
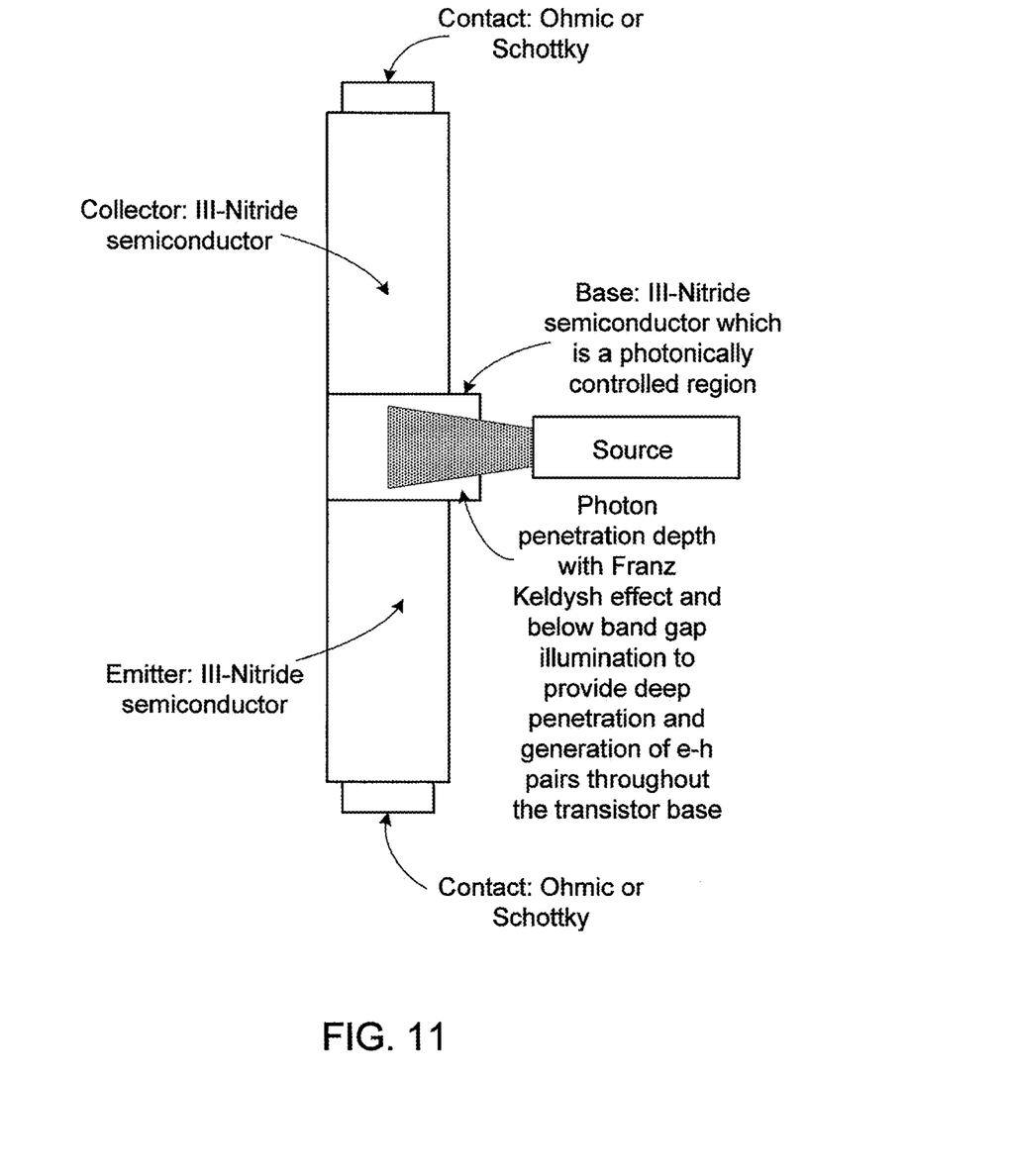
FIG. 11 illustrates an electro-optically controlled bipolar junction transistor in accordance with the invention.

When the laser pulse duration for device 400 is shorter than 1 nanosecond, the switch resistivity recovers before the pulse is over and the pulse duration is truncated by the now open switch. For example, using device 400 and adjusting the pulse generator to a pulse width of 500 picoseconds, output pulse 701 is also approximately 500 picoseconds as illustrated in FIG. 7.

As previously noted, devices fabricated in accordance with the present invention may be used for fast, medium and slow switching applications. Basically any application that requires mitigation of the gate or base capacitance and that utilizes a transistor or switching geometry is an application that can be significantly simplified by the present invention. Exemplary applications include HEMTs, MOSFETs, FETs, transistors, SCRs, GTOs and any device that is controlled by an external signal applied to a gate or base structure. Additionally, high voltage applications that require the switching device to operate serially and at very high voltages, e.g., 1000 V to 4 MV, may utilize the present invention since the inherent properties of many III-nitride materials (e.g., GaN, AlGaN, etc.) have very high breakdown voltages (e.g., 1-8 MV/cm). Furthermore, due to the inherent thin structures used in the present devices, relatively fast switching times can be achieved. For example, using uncompensated material (e.g., GaN) switching times less than a picosecond up to several nanoseconds are obtainable. Lastly, the optical signal applied to the gate or base of the disclosed device can be provided by a laser diode or other optical source, either directly or by an optical transport mechanism such as an optical fiber. FIGS. 8-11 illustrate a few of the configurations that may be used with the present invention.

It should be understood that the accompanying figures are only meant to illustrate, not limit, the scope of the invention and should not be considered to be to scale.

Systems and methods have been described in general terms as an aid to understanding details of the invention. In some instances, well-known structures, materials, and/or operations have not been specifically shown or described in detail to avoid obscuring aspects of the invention. In other instances, specific details have been given in order to provide a thorough understanding of the invention. One skilled in the relevant art will recognize that the invention may be embodied in other specific forms, for example to adapt to a particular system or apparatus or situation or material or component, without departing from the spirit or essential characteristics thereof. Therefore the disclosures and descriptions herein are intended to be illustrative, but not limiting, of the scope of the invention.

What is claimed is:

1. An optically controlled Schottky diode-based transistor comprising:
   a. a III-nitride semiconductor layer having an active region;
   b. a pair of co-planar Schottky metal conductive contacts coupled to the III-nitride semiconductor layer;
   c. a voltage source coupled to the pair of Schottky metal conductive contacts to generate an electric field sufficiently high to alter the photon absorption depth of the transistor in accordance with the Franz-Keldysh effect; and
   d. a photon source comprising a laser diode and wherein the photon source impinges the transistor perpendicular to the plane of the conductive contacts and is focused between the pair of Schottky metal conductive contacts; and
   wherein the Schottky metal contacts comprise gold or mercury and the proton source has a wavelength at least 2 nanometers longer than a wavelength corresponding to the bandgap energy.

2. The optically controlled Schottky diode-based transistor of claim 1, wherein the III-nitride semiconductor layer is selected from a group consisting of BN, AlN, GaN, and InN and has a purity high enough to have a breakdown voltage ranging from 1 to 8 MV/cm; wherein the device is configured to block fault mode signals and less optical energy is required to generate sufficient hole-electron pairs to reduce the resistance of the semiconductor region between the pair of conductive contacts when applied by the electric field.

3. The optically controlled Schottky diode-based transistor of claim 1, wherein the transistor is illuminated by a photon source and the transistor recovers a high resistivity condition.

4. The optically controlled Schottky diode-based transistor of claim 1, wherein a gate corresponding to the transistor operates in avalanche mode.

5. The optically controlled Schottky diode-based transistor of claim 1, wherein the conductivity of the transistor varies in direct proportion to the intensity of the photon source.

6. The optically controlled Schottky diode-based transistor of claim 1, wherein the transistor is doped or undoped.

7. The optically controlled Schottky diode-based transistor of claim 1, wherein the transistor has a switching time in the range of milliseconds to less than a picosecond, and wherein the transistor is operated at a radio frequency range of a kilohertz to a terahertz.

8. The optically controlled Schottky diode-based transistor of claim 1, wherein at least a portion of the active region of the transistor is contacted with the optical signal to produce a leakage current in the transistor between the Schottky metal conductive contacts.

9. The optically controlled Schottky diode-based transistor of claim 1, wherein the leakage current is independent of the polarity of the voltage applied and wherein the transistor is operated at a range from about 100V to about 20MV.

10. The optically controlled Schottky diode-based transistor of claim 1, wherein the photon source has a wavelength between 2 nanometers and 10 microns.

11. A high speed optical switch comprising:
    a. a III-nitride semiconductor layer having an active region;
    b. a pair of co-planar ohmic conductive contacts coupled to the III-nitride semiconductor layer;
    c. an ohm transmission line contacted to the distal side of the pair of co-planar ohmic conductive contacts; and
    d. a photon source comprising a laser diode and wherein the photon source impinges the semiconductor layer perpendicular to the plane of the pair of co-planar conductive contacts and is focused between the pair of co-planar ohmic conductive contacts; and
    wherein the pair of co-planar ohmic conductive contacts comprise nickel, titanium, or GaN, and the proton source has a wavelength at least 2 nanometers longer than a wavelength corresponding to the bandgap energy; and
    wherein the conductivity of the switch varies in direct proportion to the intensity of the photon source.

12. The high speed optical switch of claim 11, wherein the III-nitride layer is selected from a group consisting of BN, AlN, GaN, and InN and has a purity high enough to have a breakdown voltage ranging from 1 to 8 MV/cm, and wherein the device is configured to block fault mode signals, wherein less optical energy is required to generate sufficient hole-electron pairs to reduce the resistance of the semiconductor region between the pair of conductive contacts when applied by the electric field.

13. The high speed optical switch of claim 11, wherein the photon source is off the semiconductor layer and does not conduct current between the pair of ohmic conductive contacts.

14. The high speed optical switch of claim 11, wherein the switch is illuminated by a photon source and the switch recovers a high resistivity condition and wherein a gate corresponding to the switch operates in avalanche mode.

15. The high speed optical switch of claim 11, wherein the conductivity of the switch varies in direct proportion to the intensity of the photon source.

16. The high speed optical switch of claim 11, wherein the transistor is doped or undoped.

17. The high speed optical switch of claim 11, wherein the transistor has a switching time in the range of milliseconds to less than a picosecond, and wherein the transistor is operated at a radio frequency range of a kilohertz to a terahertz.

18. The high speed optical switch of claim 11, wherein at least a portion of the active region of the switch is contacted with the optical signal to produce a leakage current in the switch between the ohmic metal conductive contacts.

19. The high speed optical switch of claim 11, wherein the leakage current is independent of the polarity of the voltage applied and wherein the transistor is operated at a range from about 100V to about 20MV.

20. The high speed optical switch of claim 11, wherein the photon source has a wavelength between 2 nanometers and 10 microns.

\* \* \* \* \*